(12) United States Patent
Huang

(10) Patent No.: US 6,337,797 B1
(45) Date of Patent: Jan. 8, 2002

(54) NETWORK INTERFACE CARD FRAME

(75) Inventor: Tzu-Sung Huang, Taipei (TW)

(73) Assignee: Teconn Electronics Inc., Taipei (TW)

(*) Notice: Subject to any disclaimer, the term of this patent is extended or adjusted under 35 U.S.C. 154(b) by 0 days.

(21) Appl. No.: 09/635,645

(22) Filed: Aug. 10, 2000

(51) Int. Cl.$^7$ .............................. H05K 5/03; H05K 7/14
(52) U.S. Cl. ...................... 361/737; 361/752; 361/801; 211/41.17; 206/706
(58) Field of Search ................................ 361/728, 736, 361/737, 801, 753, 752; 29/841; 211/41.17; 206/706

(56) References Cited

U.S. PATENT DOCUMENTS

| | | |
|---|---|---|
| 5,397,857 A | 3/1995 | Farquhar et al. ............ 174/52.1 |
| 5,475,919 A | 12/1995 | Wu et al. ..................... 29/841 |

Primary Examiner—Jayprakash N. Gandhi
(74) Attorney, Agent, or Firm—Jacobson Holman, PLLC

(57) ABSTRACT

A network interface card frame comprises chiefly an upper and a lower cover with a metal plate embedded inside respectively and a circuit board encapsulated between the two covers. At both lateral sides of metal plates designed a continuous first folding and second folding rim, a plurality of holes disposed on the second folding rim in order to make metal plates firmly secured within upper and lower plastic frame. At perimeter of the lower connection section of upper cover, a convex edge arranged there with an exterior angle on it. And a concave edge is mounted on the upper connection section of lower cover, corresponding to the convex edge, with a lead angle formed on the interior angle of the concave edge. The exterior angle of convex edge on upper cover could be mounted on the lead angle of the concave edge on lower cover, then the two covers are welded together by using sonic welding so as to avoid welding material spilling over on the surface of interface card.

4 Claims, 3 Drawing Sheets

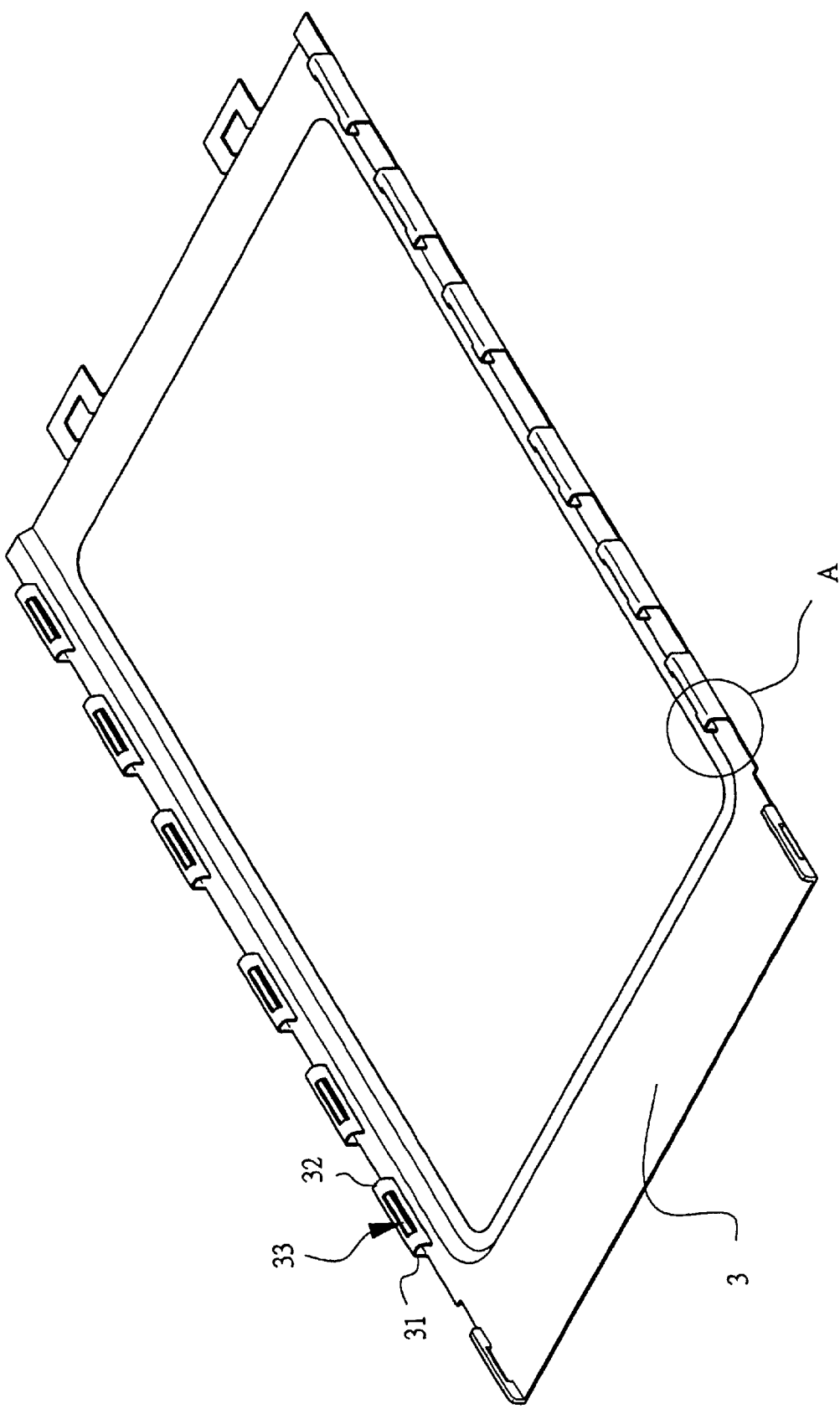

NETWORK INTERFACE CARD FRAME

BACKGROUND OF THE INVENTION

1. Field of the Invention

The present invention relates to a network interface card frame which comprises an upper and a lower covers with a metal plate embedded inside respectively while at both edges of metal plates designed a continuous first folding and second folding rim in order to make metal plates firmly secured within upper and lower plastic frames.

2. Description of the Prior Art

The conventional Network Interface Card such as PCM-CIA card normally comprises steel upper and lower covers which possess several hooks at both edges. The PCMCIA card manufacturing process in U.S. Pat. No. 5475919, for example, steel upper and lower covers with hooks on two lateral sides are put in first and second mold to build first and second frame by injection molding. The first and second frame has V type groove which could join each other and then the PC board with transmitting bus is disposed within the first and second frame, then the two covers are welded together by sonic welding. However, the fasten strength of hooks on lateral sides of upper and lower covers in connection with the first and second frames is weak thus easy to loosen quickly. In addition, the welding material will easily spill over during welding.

Refer to the U.S. Pat. No. 5397857, the two covers (upper and lower) of RAM module are manufactured by two steel plates secured to a plastic frame respectively. The fingers extending from lateral sides of steel plates wrap around the plastic frame thus provides a double layer of metal at the perimeter of the plastic frame.

The two covers are welded together using sonic welding and used to encapsulate the PC Board as well as fixed it on proper position.

The steel plates are secured to the plastic frame just by fingers. This can't make them fasten with each other firmly thus easily to loose soon. When being welded, the welding material also easily spills over.

SUMMARY OF THE INVENTION

It is therefore a primary object of the present invention to provide a notebook interface card frame that comprises an upper and a lower covers, each with a metal plate embedded inside a plastic frame. A continuous first folding and second folding rim is disposed on two lateral sides of the metal plate so that the metal plates can fasten firmly on covers without loosing.

It is a further object of the present invention to provide a notebook Interface Card frame which a convex edge arranged at the lower connection section of upper cover as well as a concave edge at the connection surface of lower cover, corresponding to each other. Therefore, the spillover of welding material on the surface of interface card can be avoided.

BRIEF DESCRIPTION OF THE DRAWINGS

The accomplishment of the above-mentioned object of the present invention will become apparent from the following description and its accompanying drawings which disclose illustrative an embodiment of the present invention, and are as follows:

FIG. 3.is a perspective view of the metal plate of the present invention;

DETAILED DESCRIPTION OF THE PREFERRED EMBODIMENT

Figure 1:
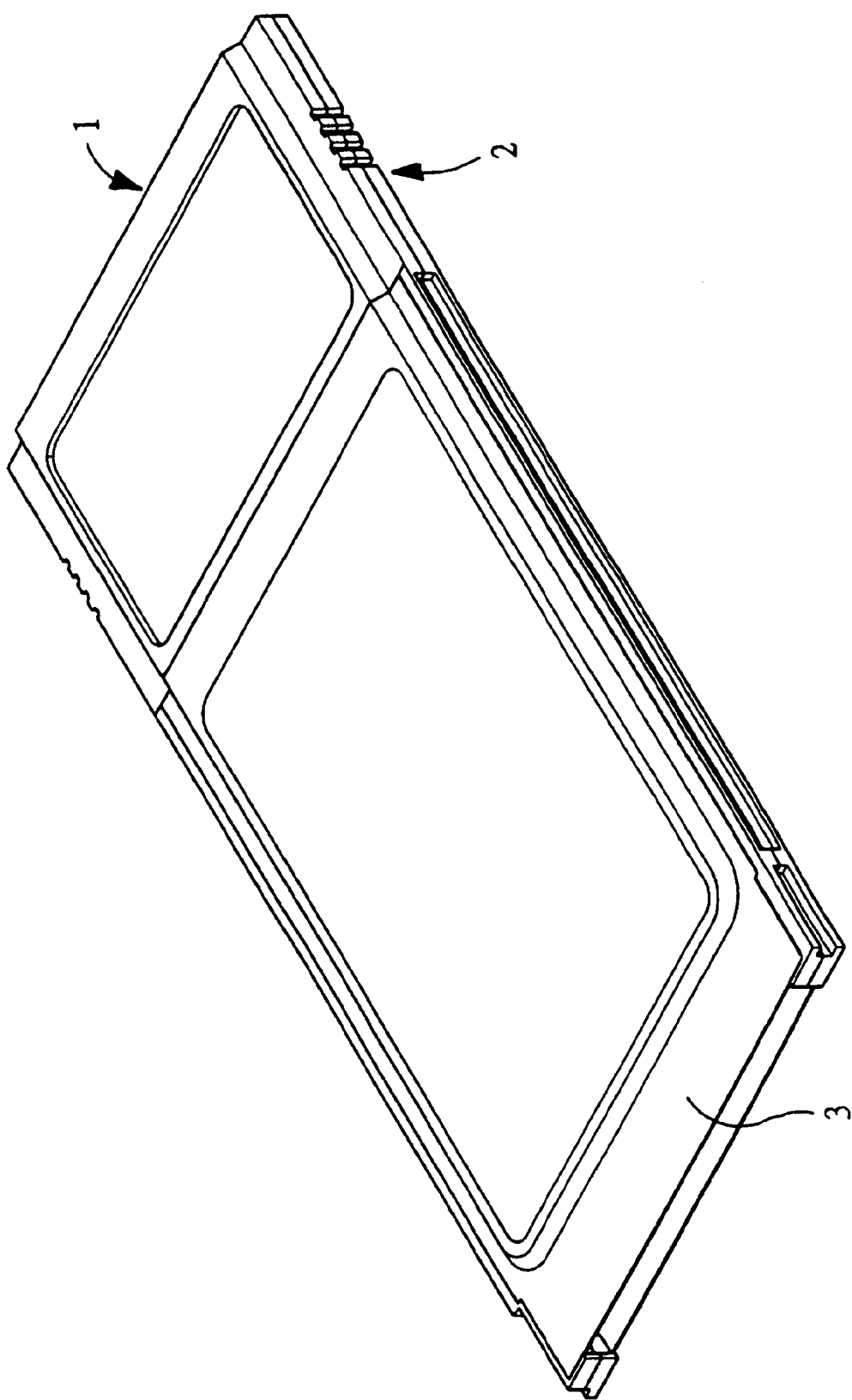
FIG. 1 is a perspective view of the present invention.
Figure 2:
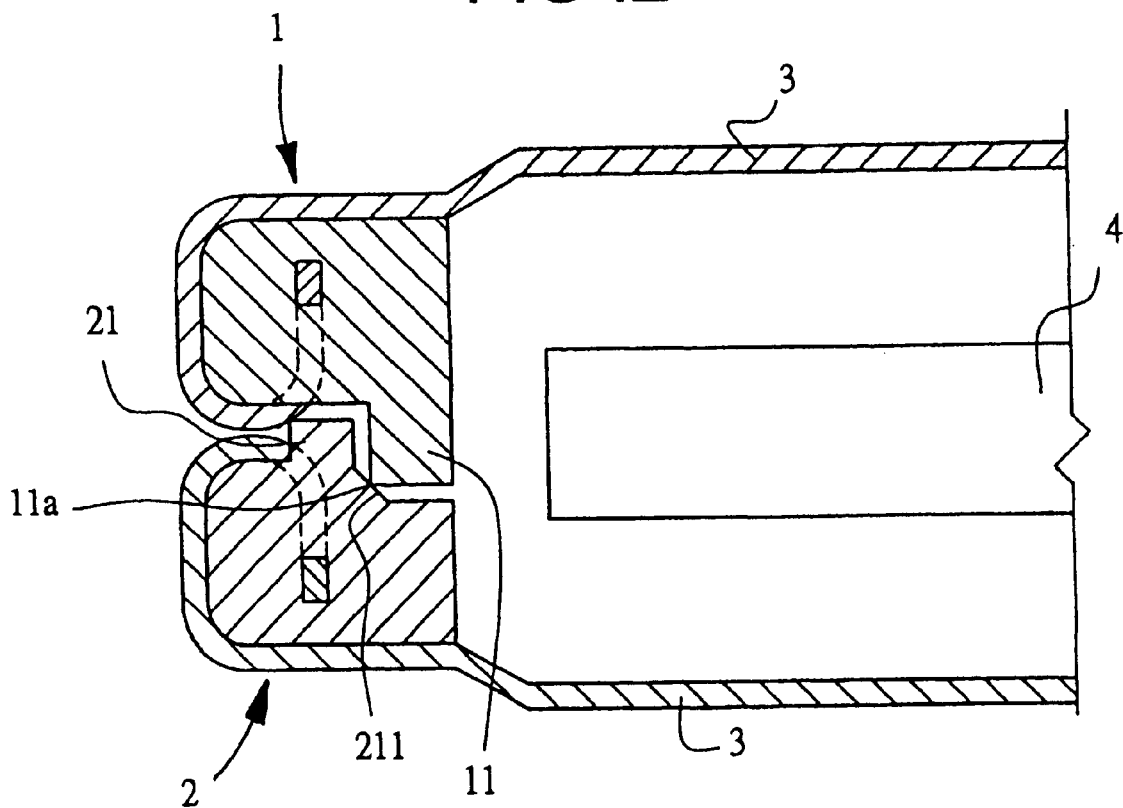
FIG. 2 is a sectional view of the present invention.
Figure 4:
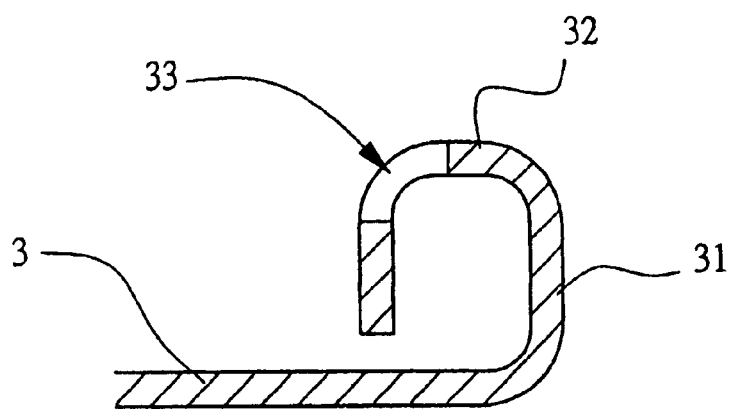
FIG. 4 is a sectional view taken along A—A of FIG. 3.

First of all, referring to FIGS. 1 and 2, the Network Interface Card frame in accordance with the present invention primarily comprising an upper cover 1 and a lower cover 2, a metal plate 3 embedded within each cover 1,2 and a PC Board 4 disposed between the upper cover 1 and the lower cover 2. The improvement of the device is characterized by:

a first folding 31 and second folding rim 32 arranged at both lateral sides of metal plates 3 continuously, a plurality of holes 33 disposed on the second folding rim as shown on FIG. 3 and FIG. 4 in order to make metal plates 3 firmly secured to the upper 1 and lower cover 2. A convex edge 11 is arranged at the perimeter of the lower connection section on the upper cover 1 while a concave edge 21 corresponding to the convex edge 11 is located at perimeter of the connection surface on the lower cover 2. A lead angle 211 forms on the interior angle of the concave edge 21. Thus the exterior angle 11 a of convex edge 11 on the upper cover 1 can be inserted into the lead angle 211 of the concave edge 21 on the lower cover 2 and then the two covers 1,2 are welded together by sonic welding.

In accordance with the structure mentioned above, the first folding 31 and second folding rim 32 arranged continuously at both lateral sides of metal plates 3 as well as a plurality of holes 33 on the second folding rim 32 can increase the fasten strength of the metal plates 3 in connection with the two covers 1,2. Thus the metal plates 3 can fasten firmly with the upper 1 and lower cover 2 when the upper cover 1 and the lower cover 2 are formed by injection molding.

Moreover, the exterior angle 11 a of convex edge 11 on the upper cover 1 is inserted into the lead angle 211 of the concave edge 21 on the lower cover 2 so that the spillover of welding material can be avoided when the upper 1 and lower cover 2 being welded by sonic welding and the quality of manufacturing is also improved.

Additionally, the device is also applied in area of memory card of PCMICA, CF card, palm PC, digital camera besides Notebook PC.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claim.

I claim:

1. A Network Interface Card frame comprising:

an upper rectangular cover having parallel lateral sides and ends perpendicular to said lateral sides;

a lower rectangular cover having parallel lateral sides and ends perpendicular to said lateral sides;

a metal plate embedded within each said cover;

a PC Board disposed between the upper cover and the lower cover;

a plurality of first folding arranged continuously at both lateral sides of said upper and lower covers, each said first folding including a second folding rim extending inwardly toward said metal plate, and each said second folding rim having a hole disposed thereon in order to make said metal plates firmly secured to said upper and lower covers;

a convex edge arranged at the perimeter of a lower connection section on said upper cover; and a concave edge corresponding to said convex edge located at perimeter of a connection surface of said lower cover so that an exterior angle of said convex edge on said upper cover can be inserted into a lead angle formed on the interior angle of said concave edge on said lower cover, then said upper and lower covers are welded together by sonic welding and spilling of welding material over said PC Board is avoided.

2. The network frame of claim 1, wherein said plurality first folding are equally spaced on each said lateral side of said covers.

3. The network frame of claim 1, wherein said upper and lower covers are formed by injection molding.

4. The network frame of claim 1, wherein said PC Board includes PCMICA, CF card, palm PC, or digital cameras.

\* \* \* \* \*